US012133473B2

(12) United States Patent
Dutta et al.

(10) Patent No.: US 12,133,473 B2
(45) Date of Patent: Oct. 29, 2024

(54) CONTACT STRUCTURE FORMATION FOR MEMORY DEVICES

(71) Applicant: International Business Machines Corporation, Armonk, NY (US)

(72) Inventors: Ashim Dutta, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 501 days.

(21) Appl. No.: 17/484,453

(22) Filed: Sep. 24, 2021

(65) Prior Publication Data

US 2023/0102165 A1 Mar. 30, 2023

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
CPC ......... H10N 50/80; H10N 50/01; H10B 61/00
See application file for complete search history.

(56) References Cited

U.S. PATENT DOCUMENTS

| 6,461,959 | B1 * | 10/2002 | Chien ............... H01L 21/76889 438/396 |
| 7,211,849 | B2 | 5/2007 | Hineman et al. |
| 9,343,659 | B1 | 5/2016 | Lu et al. |
| 9,614,143 | B2 | 4/2017 | Lu et al. |
| 10,096,768 | B2 | 10/2018 | Jiang et al. |
| 10,256,397 | B2 | 4/2019 | Annunziata et al. |
| 10,461,247 | B2 | 10/2019 | Shum et al. |
| 10,529,913 | B1 | 1/2020 | Chen et al. |
| 10,535,816 | B2 | 1/2020 | Wu et al. |
| 10,707,413 | B1 | 7/2020 | Dutta et al. |
| 10,964,887 | B2 | 3/2021 | Yang et al. |
| 2013/0119494 | A1 | 5/2013 | Li et al. |
| 2016/0365505 | A1 | 12/2016 | Lu et al. |
| 2020/0403032 | A1 | 12/2020 | Dutta et al. |
| 2023/0110380 | A1 * | 4/2023 | Wang ..................... H10B 61/00 257/427 |

FOREIGN PATENT DOCUMENTS

CN 112349322 A 2/2021

* cited by examiner

*Primary Examiner* — Christine A Enad
(74) *Attorney, Agent, or Firm* — L. Jeffrey Kelly; Ryan, Mason & Lewis, LLP

(57) ABSTRACT

A semiconductor structure comprises a memory device comprising a first electrode, at least one memory element layer disposed on the first electrode, and a second electrode disposed on the at least one memory element layer. An encapsulation layer is disposed around side surfaces of the memory device. The semiconductor structure also comprises a conductive cap layer disposed on a top surface of the encapsulation layer and around a portion of side surfaces of the encapsulation layer. A contact is disposed on the second electrode and extends around the side surfaces of the memory device.

20 Claims, 11 Drawing Sheets

100

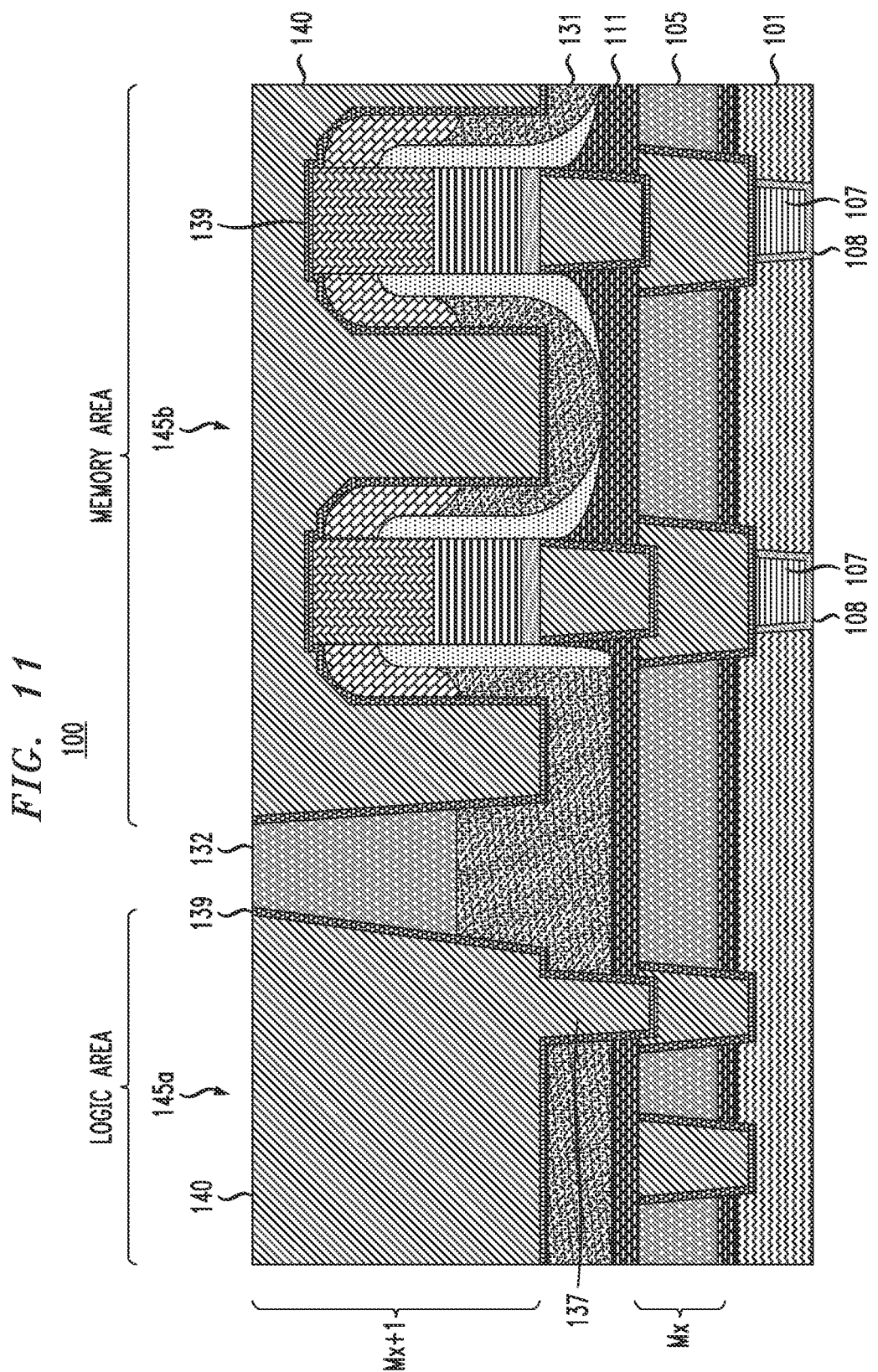

CONTACT STRUCTURE FORMATION FOR MEMORY DEVICES

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming memory device contact structures.

In one embodiment, a semiconductor structure comprises a memory device comprising a first electrode, at least one memory element layer disposed on the first electrode, and a second electrode disposed on the at least one memory element layer. An encapsulation layer is disposed around side surfaces of the memory device. The semiconductor structure also comprises a conductive cap layer disposed on a top surface of the encapsulation layer and around a portion of side surfaces of the encapsulation layer. A contact is disposed on the second electrode and extends around the side surfaces of the memory device.

In another embodiment, a semiconductor structure comprises a first dielectric layer formed on a second dielectric layer, a memory device disposed in the first and second dielectric layers, an encapsulation layer disposed around side surfaces of the memory device, and a conductive cap layer disposed on a top surface of the encapsulation layer and around a portion of side surfaces of the encapsulation layer.

In another embodiment, a method of forming a semiconductor structure comprises forming a memory device structure comprising a bottom electrode, at least one memory element layer stacked on the bottom electrode, and a top electrode stacked on the at least one memory element layer, and depositing an encapsulation layer on top of and around sides of the memory device structure. In the method, a portion of the encapsulation layer is removed to expose a top surface and part of side surfaces of the top electrode, and a dielectric layer is deposited around a lower part of the memory device structure and a lower part of the encapsulation layer. A conductive cap layer is formed on the dielectric layer, around an upper part of the memory device structure and around an upper part of the encapsulation layer. The conductive cap layer is further formed on a top surface of the encapsulation layer.

In another embodiment, a method of forming a semiconductor structure comprises forming a dielectric encapsulation layer around sides of a memory device structure comprising a bottom electrode, at least one memory element layer stacked on the bottom electrode, and a top electrode stacked on the at least one memory element layer. In the method, a dielectric layer is deposited around a lower part of the dielectric encapsulation layer, and a conductive cap layer is formed on the dielectric layer. The conductive cap layer covers an upper part of the dielectric encapsulation layer.

In another embodiment, a semiconductor structure comprises a dielectric encapsulation layer disposed around sides of a memory device structure comprising a bottom electrode, at least one memory element layer stacked on the bottom electrode, and a top electrode stacked on the at least one memory element layer, a dielectric layer disposed around a lower part of the dielectric encapsulation layer, and a conductive cap layer disposed on the dielectric layer, wherein the conductive cap layer covers an upper part of the dielectric encapsulation layer. A contact is disposed over the memory device structure and extends downward around side surfaces of the top electrode, the at least one memory element layer and the bottom electrode. The conductive cap layer is disposed between the contact and the upper part of the dielectric encapsulation layer.

BRIEF DESCRIPTION OF THE DRAWINGS

FIG. 11 is a schematic cross-sectional view illustrating contact and via formation in the structure of FIG. 10, according to an embodiment of the invention.

DETAILED DESCRIPTION

Figure 1:
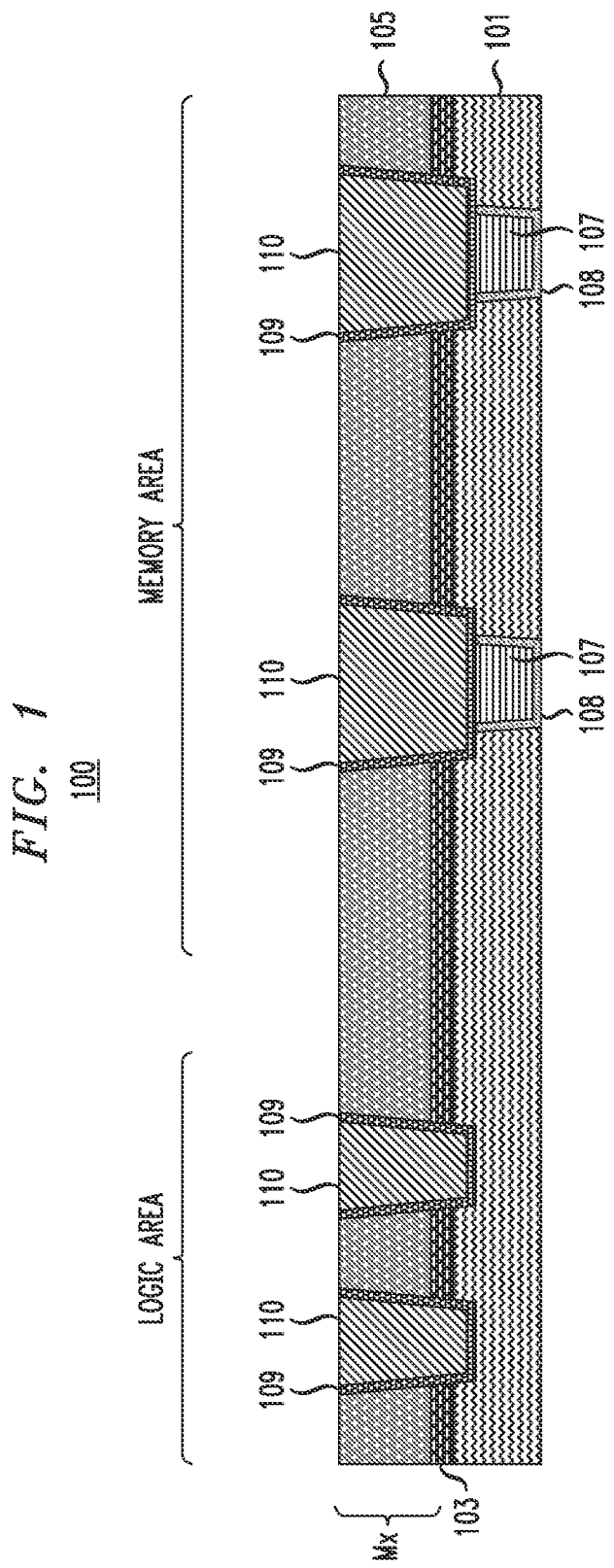
FIG. 1 is a schematic cross-sectional view illustrating a lower metallization level of a semiconductor structure including contacts in a logic area and in a memory area, according to an embodiment of the invention.

Illustrative embodiments of the invention may be described herein in the context of illustrative methods for forming memory device contact structures that prevent shorting by providing a conductive cap layer that protects an encapsulation layer from erosion during etching to form a top contact, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Certain integration schemes require memory elements in the back-end-of-line (BEOL). Such memory elements may be formed in a column or pillar shape. The memory elements are included in memory devices such as, for example, phase-change random-access memory (PCRAM), resistive random-access memory (RRAM or ReRAM), and magnetic random-access memory (MRAM) devices.

In current memory devices, such as, for example, embedded MRAM devices, there are difficulties with preventing top contact trench etching from reaching memory element layers, resulting in shorts between top contacts and memory elements. As a result, the ability of the memory devices to fit into narrow inter-metal dielectric spaces is limited and the usage of the memory devices (e.g., MRAM devices) as currently configured is limited in advanced node technologies. Additionally, conventional structures limit cleaning of sidewalls of the memory devices (e.g., MRAM devices) after patterning, resulting in the shorting issues in tighter pitch memory device pillar arrays in BEOL applications beyond 14 nm.

Illustrative embodiments provide techniques for forming embedded memory devices where a conductive cap layer protects an encapsulation layer so that the encapsulation layer is not removed during contact trench etching. In one or more embodiments, top contacts are able to be formed in configurations where the contacts are formed around memory device stacks and extend below memory element layers and bottom electrodes of memory devices without eroding encapsulation layers. The structures and techniques of the embodiments permit fitting of the memory devices into narrow inter-metal dielectric spacing, thus extending the usage of MRAM and other memory devices to more advanced node technologies.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof are to be broadly construed to relate to the disclosed structures and methods, as oriented in the drawings, wherein such structures may be understood to have the same configuration (e.g., layers stacked in the same order) even if the structure is rotated to a different angle from that shown in the drawings.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "low-k" refers to dielectric materials having a relative dielectric constant less than 7, and includes ultra-low-k dielectric materials. As used herein, "high-k" refers to dielectric materials having a relative dielectric constant greater than 7.

FIG. 1 is a schematic cross-sectional view illustrating a lower metallization level of a semiconductor structure including contacts in a logic area and in a memory area. Referring to FIG. 1, a semiconductor device 100 includes a plurality of contacts each comprising a fill layer 110 and a liner layer 109 formed in a first inter-level dielectric (ILD) layer 105, and also extending through a first cap layer 103 and into a lower dielectric layer 101. The fill layers 110 are formed on the liner layers 109. The liner layers 109 include, for example, niobium (Nb), niobium nitride (NbN), tungsten (W), tungsten nitride (WN), tantalum (Ta), tantalum nitride (TaN), titanium (Ti), titanium nitride (TiN), ruthenium (Ru), molybdenum (Mo), chromium (Cr), vanadium (V), palladium (Pd), platinum (Pt), rhodium (Rh), scandium (Sc), aluminum (Al) and other high melting point metals or conductive metal nitrides. The liner layers are conformally formed on sidewalls and a bottom surface of a trench in the first ILD layer 105. The fill layers 110 include, an electrically conductive metal, such as, for example, tungsten, cobalt (Co), zirconium (Zr), tantalum (Ta), titanium (Ti), aluminum (Al), ruthenium (Ru), copper (Cu), metal carbides (e.g., tantalum carbide, titanium carbide, tantalum magnesium carbide), metal nitrides (e.g., titanium nitride), transition metal aluminides or combinations thereof. The liner and fill layers 109 and 110 are deposited using, for example, one or more deposition techniques, such as, but not necessarily limited to, physical vapor deposition (PVD), chemical vapor deposition (CVD), atomic layer deposition (ALD), plasma-enhanced CVD (PECVD), radio frequency CVD (RFCVD), molecular layer deposition (MLD), molecular beam deposition (MBD), liquid source misted chemical deposition (LSMCD) and/or sputtering, which can be followed by a planarization process such as, for example, chemical mechanical polishing (CMP) to planarize a top surface of the first ILD layer 105 and remove excess portions of the liner and fill layers 109 and 110. The contacts and the first ILD layer 105 can form at least part of a lower metallization level ($M_x$).

Contacts, also referred to herein as wires or conductive lines, function as electrically conductive contacts or interconnects. The contacts form electrical connections between elements and/or devices, or to elements or devices. As used herein, a "contact" or "contact structure" includes a conductive fill layer, and may further include a liner layer.

The first ILD layer 105 comprises, for example, $SiO_x$, SiOC, ultra-low-k dielectrics or some other dielectric, and is formed on the first cap layer 103. The first ILD layer 105 is deposited using deposition techniques such as, for example, CVD, PECVD, RFCVD, PVD, ALD, MBD, PLD, and/or LSMCD, followed by a planarization process, such as, for example, CMP.

The first cap layer 103 comprises, for example, NBLoK™ material, a nitride material (e.g., silicon nitride (SiN), silicon carbonitride (SiCN)), silicon carbide (SiC) or other suitable material, and is formed on the lower dielectric layer 101. NBLoK™ material is from Applied Materials, Inc. of Santa Clara, CA, and is a nitrogen-doped silicon carbide. As can be seen, the first cap layer 103 is deposited on top surfaces of the lower dielectric layer 101.

The lower dielectric layer 101 includes, for example, silicon dioxide ($SiO_2$), carbon-doped silicon oxide (SiCOH), SiLK® dielectrics, tetraethyl orthosilicate (TEOS), and/or porous forms of these low-k and ultra-low-k dielectric films. As can be understood by one of ordinary skill in the art, the lower dielectric layer 101 can be on a semiconductor substrate (not shown), with intervening layers (e.g., lower conductive lines, devices, etc.) between the dielectric layer 101 and the substrate. A semiconductor substrate may comprise semiconductor material including, but not limited to, Si, SiGe, SiC, SiGeC or other like semiconductor. In addition, multiple layers of the semiconductor materials can be used as the semiconductor material of the substrate. A plurality of devices can be on the substrate, such as, for example, transistors, capacitors, and resistors. Vias each comprising a fill layer 107 and a liner layer 108 the same or similar to the fill and liner layers 110 and 109 extend from the contacts in the memory area and may be used to connect to one or more lower conductive lines and/or devices.

Figure 2:
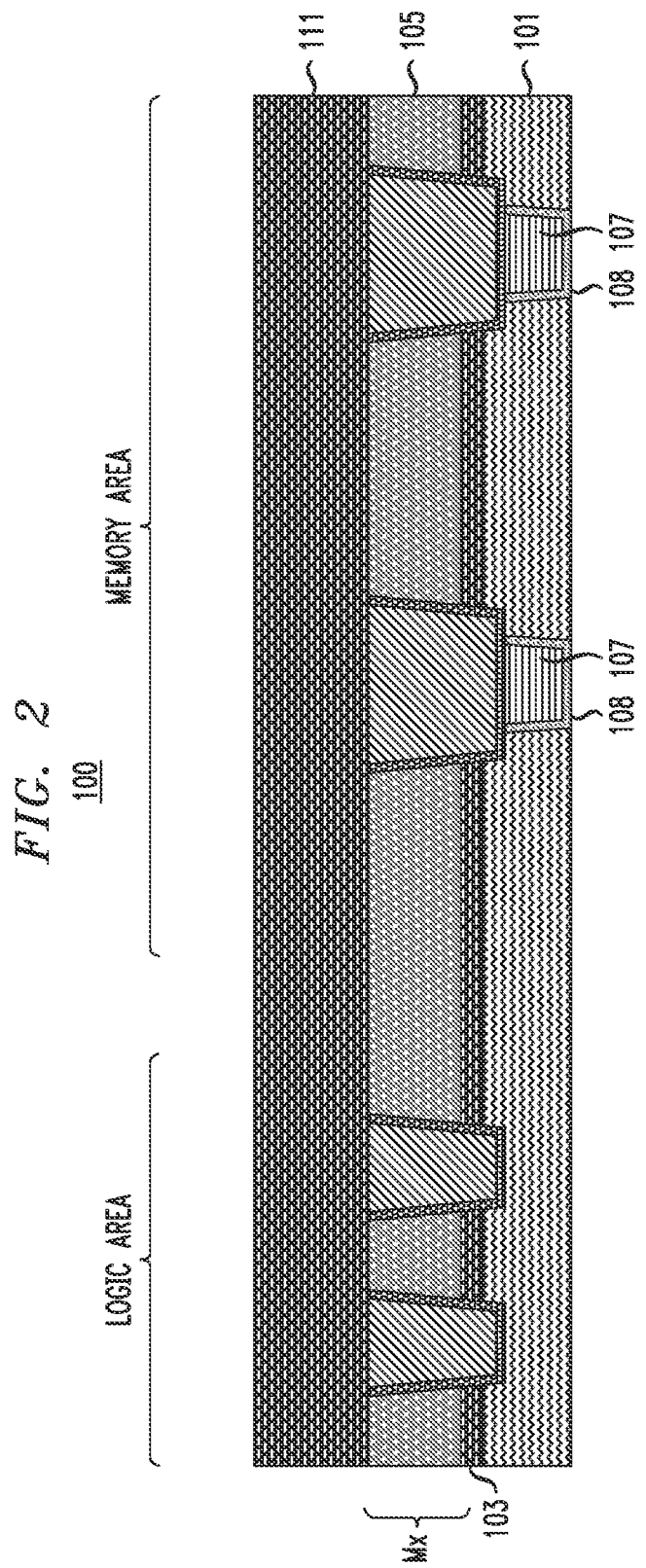
FIG. 2 is a schematic cross-sectional view illustrating formation of a dielectric cap layer on the structure of FIG. 1, according to an embodiment of the invention.

Referring to FIG. 2, a second cap layer 111 is deposited on the structure of FIG. 1. The second cap layer comprises the same or a similar material to that of the first cap layer 103, and is deposited using, for example, one or more deposition techniques, such as, but not necessarily limited to, PVD, CVD, ALD, PECVD, RFCVD, MLD, MBD, LSMCD and/or sputtering. According to an embodiment, the thickness (e.g., vertical height) of the second cap layer 111 is in the range of about 50 nm to about 500 nm.

Figure 3:
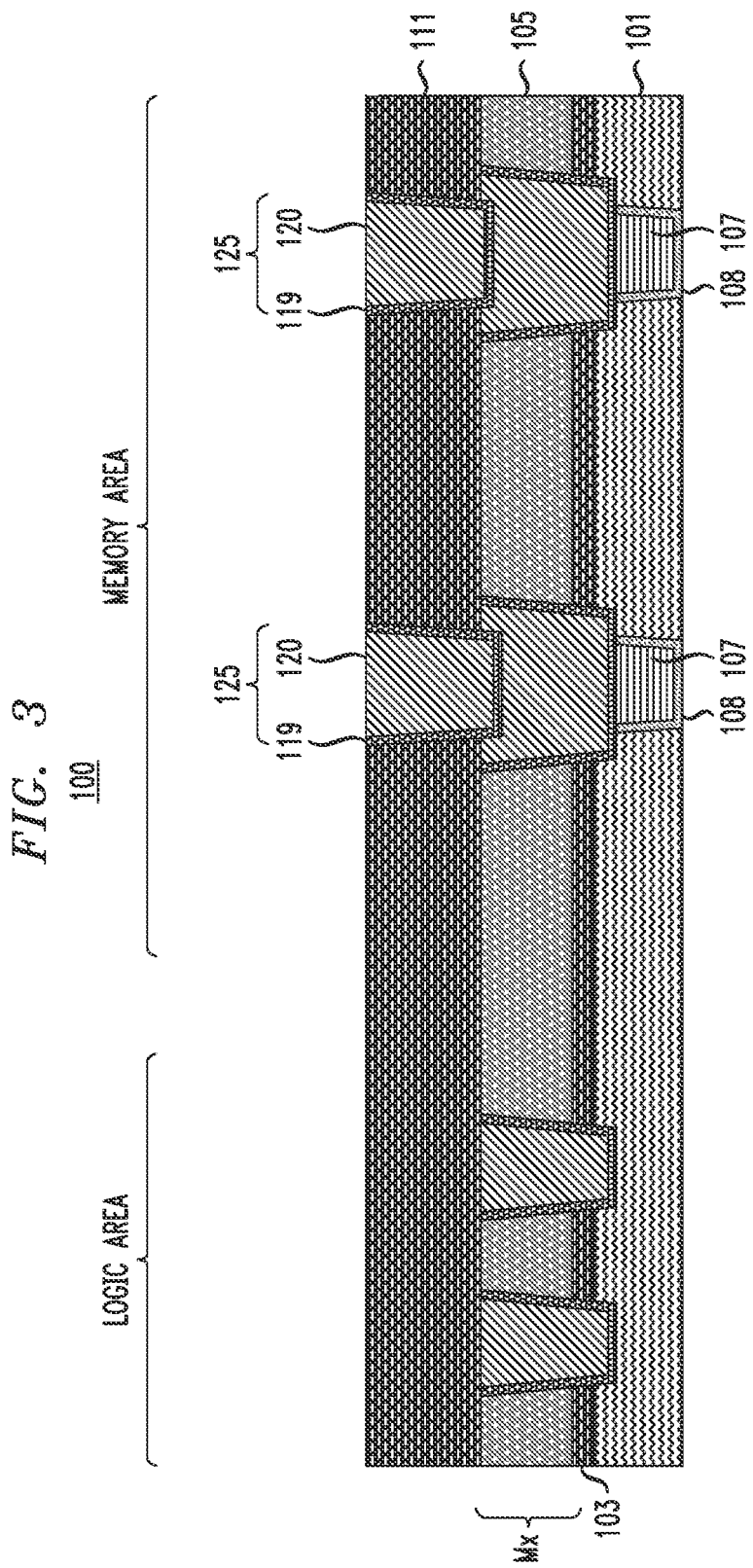
FIG. 3 is a schematic cross-sectional view illustrating formation of bottom electrode contacts in the dielectric cap layer of FIG. 2, according to an embodiment of the invention.

Referring to FIG. 3, bottom electrode contacts 125 are formed in the second cap layer 111. As explained further herein, the bottom electrode contacts 125 are contacts for a bottom electrode of memory devices that are subsequently formed on the bottom electrode contacts 125. The bottom electrode contacts 125 are formed in the memory area and extends onto or partially into contacts in the lower metallization level ($M_g$). Similar to the contacts in the lower metallization level ($M_g$), the bottom electrode contacts 125 each comprise a fill layer 120 comprising the same or similar materials to those of the fill layers 110 and a liner layer 119 comprising the same or similar materials to those of the liner layers 109. The bottom electrode contacts 125 are formed by etching portions of the second cap layer 111 over the contacts in the memory area to form trenches, in which the liner layer 119 and the fill layer 120 are deposited to fill in the trenches. The liner and fill layers 119 and 120 are deposited using the same or similar deposition techniques as those described in connection with the liner and fill layers 109 and 110. As can be seen in FIG. 3, the bottom electrode contacts 125 extend through the entire thickness of the second cap layer 111.

Figure 4:
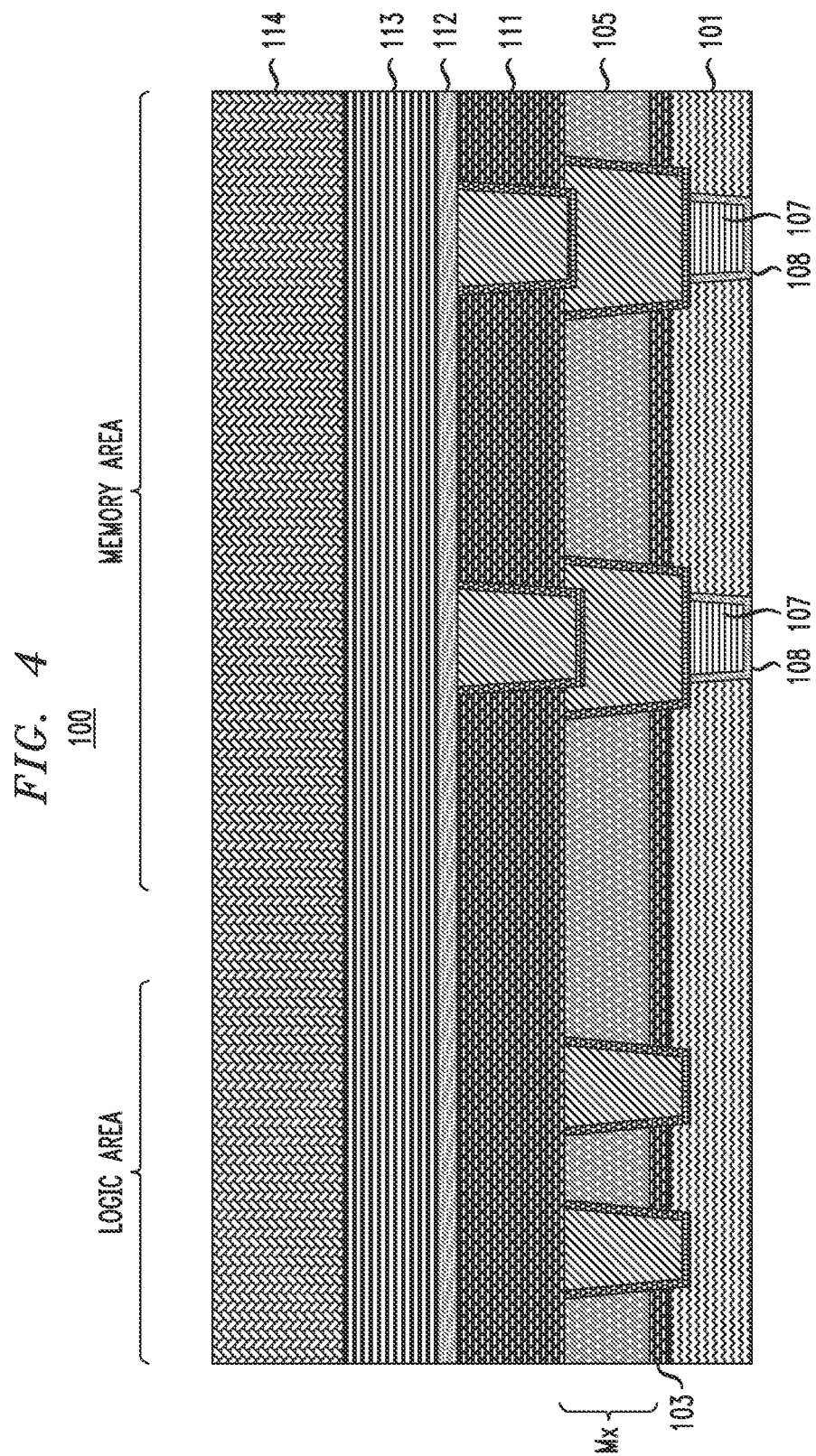
FIG. 4 is a schematic cross-sectional view illustrating formation of memory device layers on the structure of FIG. 3, according to an embodiment of the invention.

Referring to FIG. 4, a plurality of memory device layers including a bottom electrode layer 112, memory element layers 113 (e.g., MTJ layers) and a top electrode layer 114 are deposited on the structure of FIG. 3. The bottom electrode layer 112 and the top electrode layer 114 comprise, for example, TaN, TiN, Nb, NbN, W, WN, Ta, Ti, Ru, Mo, Cr, V, Pd, Pt, Rh, Sc, Al and other high melting point metals or conductive metal nitrides. According to an embodiment, the thickness of the top electrode layer 114 is larger than that of the bottom electrode layer 112. For example, the thickness of the bottom electrode layer 112 can be in the range of about 5 nm to about 50 nm and the thickness of the top electrode layer 114 can be in the range of about 50 nm to about 500 nm. The top electrode layer 114 is formed on the memory element layers 113, and the memory element layers 113 are formed on the bottom electrode layer 112. In the case of an MRAM, the memory element layers 113 include an MTJ structure comprising, for example, one or more magnetic fixed layers, non-magnetic barrier layers, free layers and oxide layers. The memory element layers 113 are not limited to those for an MRAM, and can include layers for memory elements of, for example, PCRAM, RRAM, ReRAM or other non-volatile memory devices. The bottom electrode layer 112, memory element layers 113 and top electrode layer 114 are deposited using, for example, one or more deposition techniques, such as, but not necessarily limited to, PVD, CVD, ALD, PECVD, RFCVD, MLD, MBD, LSMCD and/or sputtering.

Figure 5:
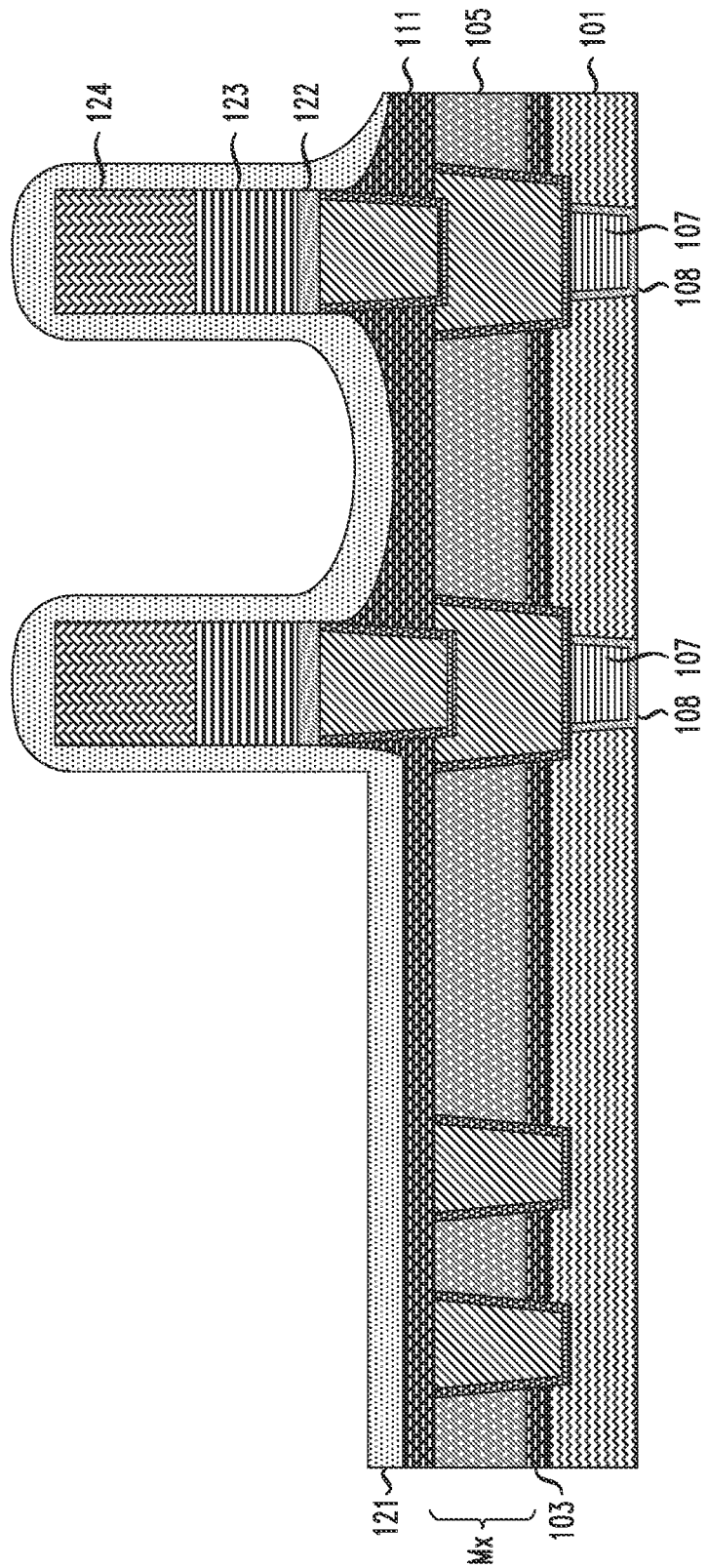
FIG. 5 is a schematic cross-sectional view illustrating patterning of the memory device layers of the FIG. 4 structure and deposition of an encapsulation layer on the patterned memory device layers, according to an embodiment of the invention.

Referring to FIG. 5, the memory device layers of the FIG. 4 structure are patterned into respective memory devices comprising a top electrode 124, a memory element 123 comprising the plurality of patterned memory element layers 113 and a bottom electrode 122. According to an embodiment, in a patterning process, an organic planarization layer (OPL) is formed on a first sacrificial dielectric layer and a second sacrificial dielectric layer is formed on the OPL. According to an embodiment, the second sacrificial dielectric layer comprises a silicon anti-reflective coating (SiARC) layer.

The OPL comprises, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL can be deposited, for example, by spin coating, to a thickness of about 100 nm-about 200 nm. Photoresists are formed on the second sacrificial dielectric layer in regions corresponding to the bottom electrode contacts 125, and where the memory device layers comprising the bottom electrode layer 112, the memory element layers 113 and the top electrode layer 114 are to be patterned into memory devices. The photoresists have a thickness in the range of about 80 nm to about 110 nm, and horizontal width which corresponds to that of the bottom electrode contacts 125 and desired widths of the resulting memory devices.

Exposed portions of the second sacrificial dielectric layer, OPL and first sacrificial dielectric layer not under the photoresists are removed by an etching process. The etching process is performed using, for example, a fluorocarbon RIE to remove the exposed portions of the second sacrificial dielectric layer, $O_2$ or $N_2/H_2$ based RIE to etch the OPL and fluorocarbon RIE to etch first sacrificial dielectric layer down to the top electrode layer 114. According to an embodiment, the photoresists and second sacrificial dielectric layer are removed leaving the patterned OPL and first sacrificial dielectric layer. The second sacrificial dielectric layer is removed during etching of the first sacrificial dielectric layer. The OPL and the patterned first sacrificial dielectric layer remain covering the areas corresponding to bottom electrode contacts 125, where the memory devices will be formed.

Using the OPL and the first sacrificial dielectric layer as a mask, the top electrode layer 114 is etched into the top electrode 124. The remaining OPL is then removed using, for example, oxygen plasma, nitrogen plasma, hydrogen plasma or other carbon strip or ashing process. The stripping process causes minimal or no damage to the remaining layers. Using the first sacrificial dielectric layer and top electrode 124 as mask, memory element layers 113 and bottom electrode layer 112 are patterned to result in the memory devices each comprising a top electrode 124, a memory element 123 and a bottom electrode 122. According to an embodiment, the first sacrificial dielectric layer and part of the top electrode 124 are removed during memory element layer 113 and bottom electrode layer 112 patterning. As illustrated in FIG. 5, the patterning process, which comprises for example, ME and ion beam etch (IBE) processes, removes portions of the second cap layer 111 and creates curved (e.g., gouged) portions of the second cap layer 111. As can be seen, the curved portions are carved-out curved portions of the second cap layer 111. The remaining portions of the second cap layer 111 are formed on sides of bottom electrode contacts 125.

An encapsulation layer 121 comprising, for example SiN, SiCN, SiC or other suitable material, is conformally deposited on the resulting memory device structures comprising the bottom electrodes 122, the memory elements 123 stacked on the bottom electrodes 122 and the top electrodes 124 stacked on the memory elements 123. Each of the bottom electrodes 122 is disposed on a bottom electrode contact 125. As can be seen, the encapsulation layer 121 is deposited on the remaining portions of the second cap layer 111, and also on exposed portions of the top electrodes 124, memory elements 123 and bottom electrodes 122. The encapsulation layer 121 is formed around the top electrodes 124, memory elements 123, bottom electrodes 122 and on the second cap layer 111, which is on portions of the bottom electrode contacts 125. The encapsulation layer 121 encapsulates the stacked structures of the top electrode 124, memory elements 123, bottom electrodes 122 and portions of the bottom electrode contacts 125. Portions of the second cap layer 111 are formed between the encapsulation layer 121 and the sides of the bottom electrode contacts 125. Where the encapsulation layer 121 is formed on the curved portions of the second cap layer 111, the encapsulation layer 121 has a similar curvature to that of the curved portions of the second cap layer 111. The encapsulation layer 121 is deposited using one or more conformal deposition techniques such as, for example, CVD or ALD.

Figure 6:
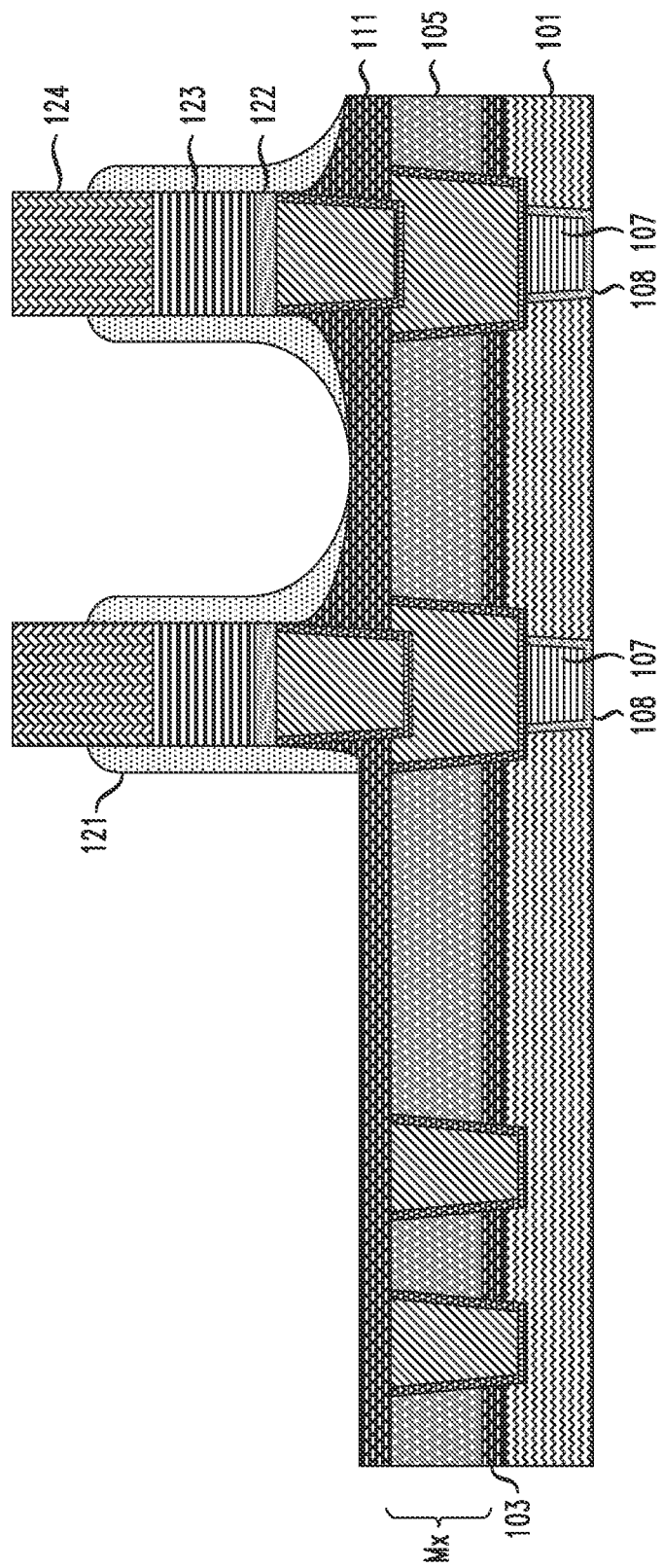
FIG. 6 is a schematic cross-sectional view illustrating etching back of the encapsulation layer from the structure of FIG. 5, according to an embodiment of the invention.

Referring to FIG. 6, portions of the encapsulation layer 121 are removed in, for example, an etchback process, to expose portions of the second cap layer 111 and a top surface and part of side surfaces of each of the top electrodes 124. According to an embodiment, an upper part of the side surfaces of each top electrode 124 is exposed by the removal of the portions of the encapsulation layer 121. Following the etchback process, the encapsulation layer 121 remains around other parts of the side surfaces of the top electrodes 124, and around the memory elements 123, bottom electrodes 122 and portions of the bottom electrode contacts 125, still encapsulating those portions of the memory devices and the bottom electrode contacts 125. The remaining portions of the encapsulation layer 121 extends from the top electrodes 124 to the bottom electrode contacts 125.

Figure 7:
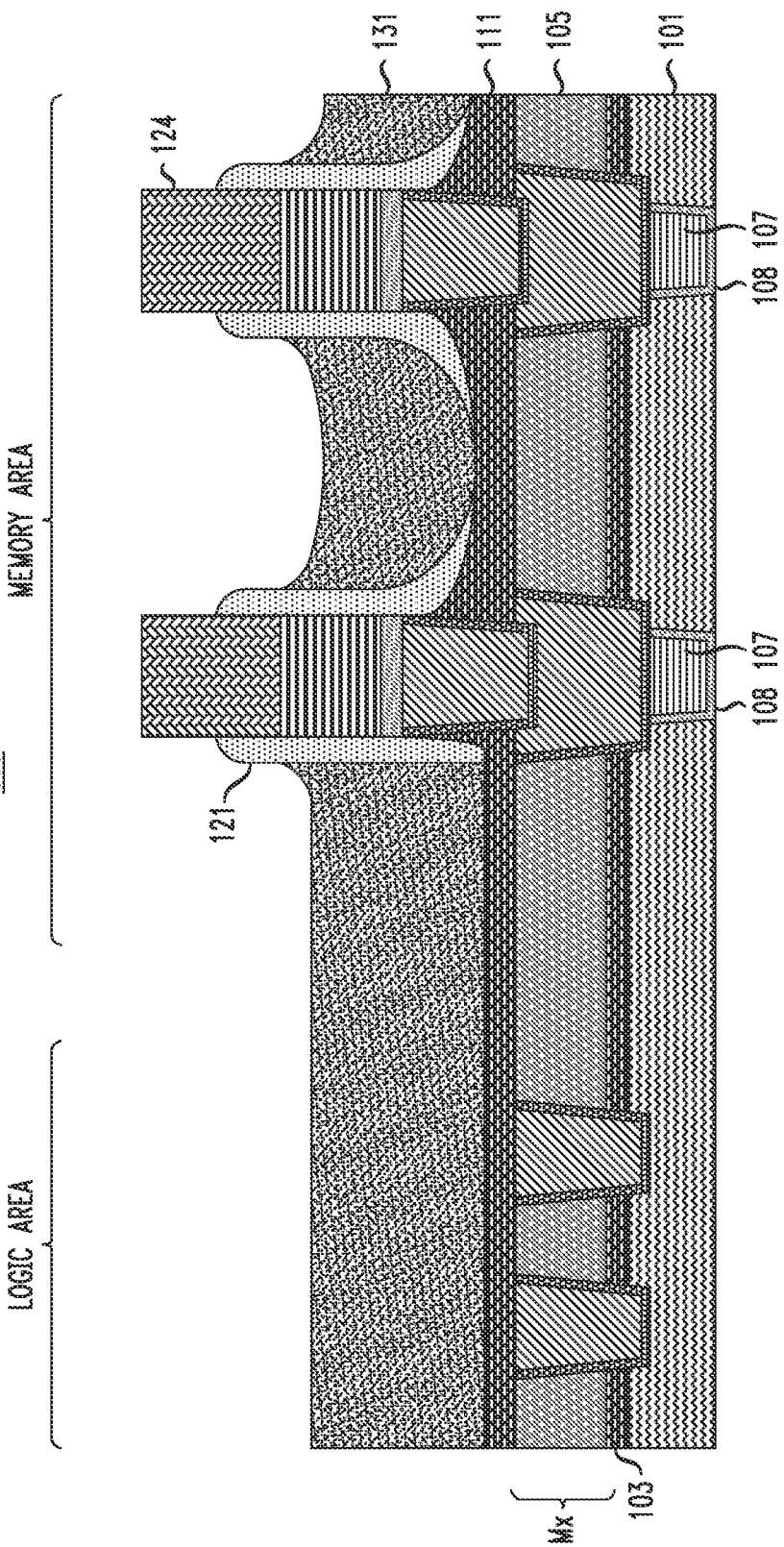
FIG. 7 is a schematic cross-sectional view illustrating deposition of an inter-level dielectric (ILD) layer on the structure of FIG. 6, according to an embodiment of the invention.

Referring to FIG. 7, a second ILD layer 131 is formed on the structure of FIG. 6. The second ILD layer 131 comprises a flowable dielectric such as, for example, a spin-on dielectric (SOD) or a flowable CVD (FCVD) dielectric including, but not necessarily limited to, a flowable oxide (FOX). The second ILD layer 131 is deposited using, for example, bottom-up dielectric fill deposition techniques such as spin-on and FCVD techniques, followed by dry processes to remove any dielectric material which may have been deposited on the top surfaces of the top electrodes 124. A fluorocarbon based ME process can be used to remove dielectric material on the top surfaces of the top electrodes 124. As can be seen in FIG. 7, a height of the second ILD layer 131 is at or near (e.g., slightly below) the height of an upper layer of each memory element 123.

Figure 8:
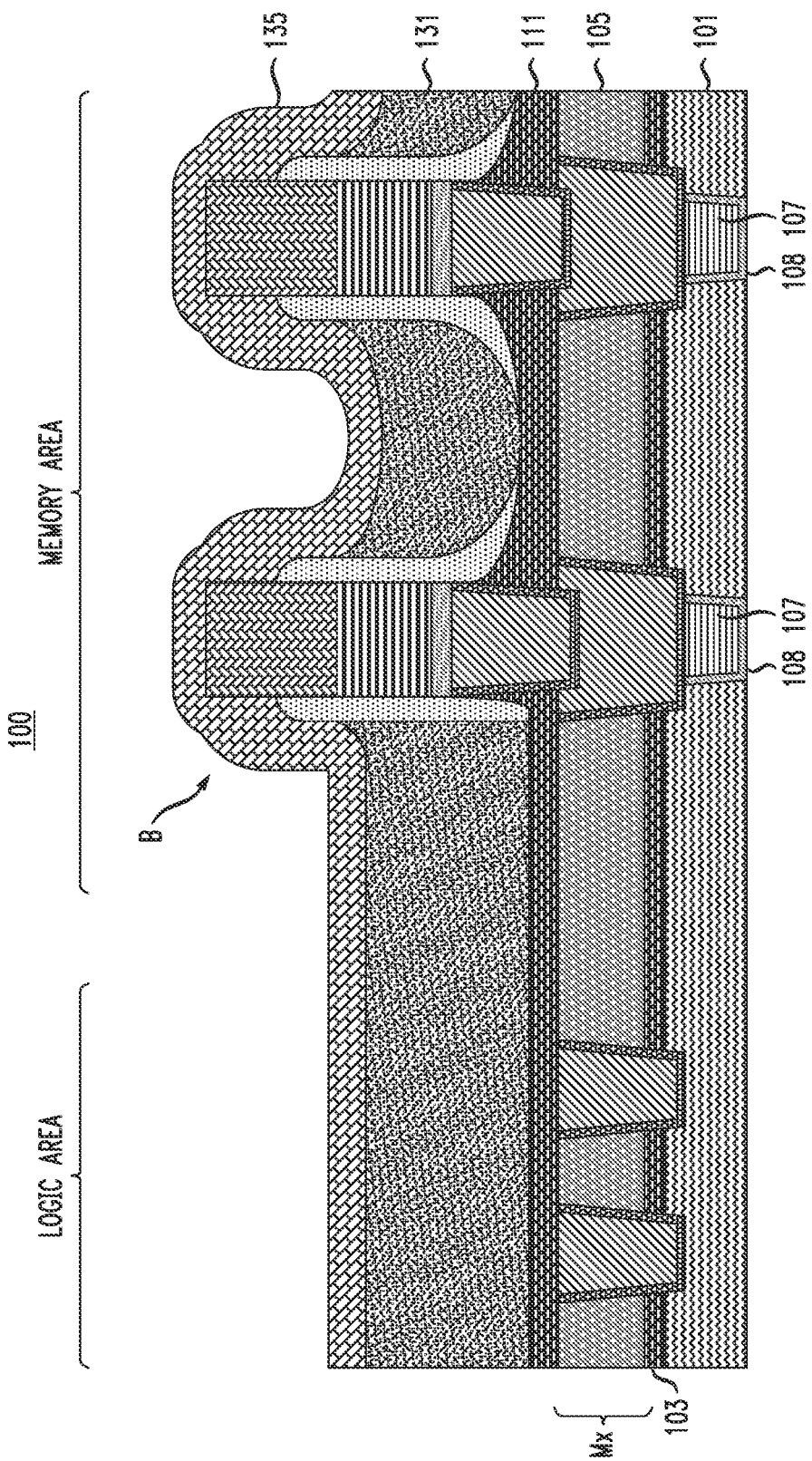
FIG. 8 is a schematic cross-sectional view illustrating deposition of a conductive cap layer on the structure of FIG. 7, according to an embodiment of the invention.

Referring to FIG. 8, a conductive cap layer 135 is deposited on the structure of FIG. 7. The conductive cap layer 135 comprises, for example, Nb, NbN, W, WN, Ta, TaN, Ti, TiN, Ru, Mo, Cr, V, Pd, Pt, Rh, Sc, Al and other high melting point metals or conductive metal nitrides, and is deposited using, for example, one or more deposition techniques, such as, but not necessarily limited to, PVD and/or CVD. As can be seen in FIG. 8, the conductive cap layer 135 is deposited on the second ILD layer 131, the portions of the encapsulation layer 121 not covered by the second ILD layer 131 (e.g., top surfaces and upper side surfaces of the encapsulation layer 121) and on top surfaces and upper side surfaces of the top electrodes 124. The deposition of the conductive cap layer 135 has a bread-loafing effect that occurs during the deposition. The bread-loafing results in thicker deposits of the material of the conductive cap layer 135 near top and upper side surfaces of the top electrode 124, forming an overhang structure that resembles a loaf of bread (see, e.g., portion B of FIG. 8).

Figure 9:
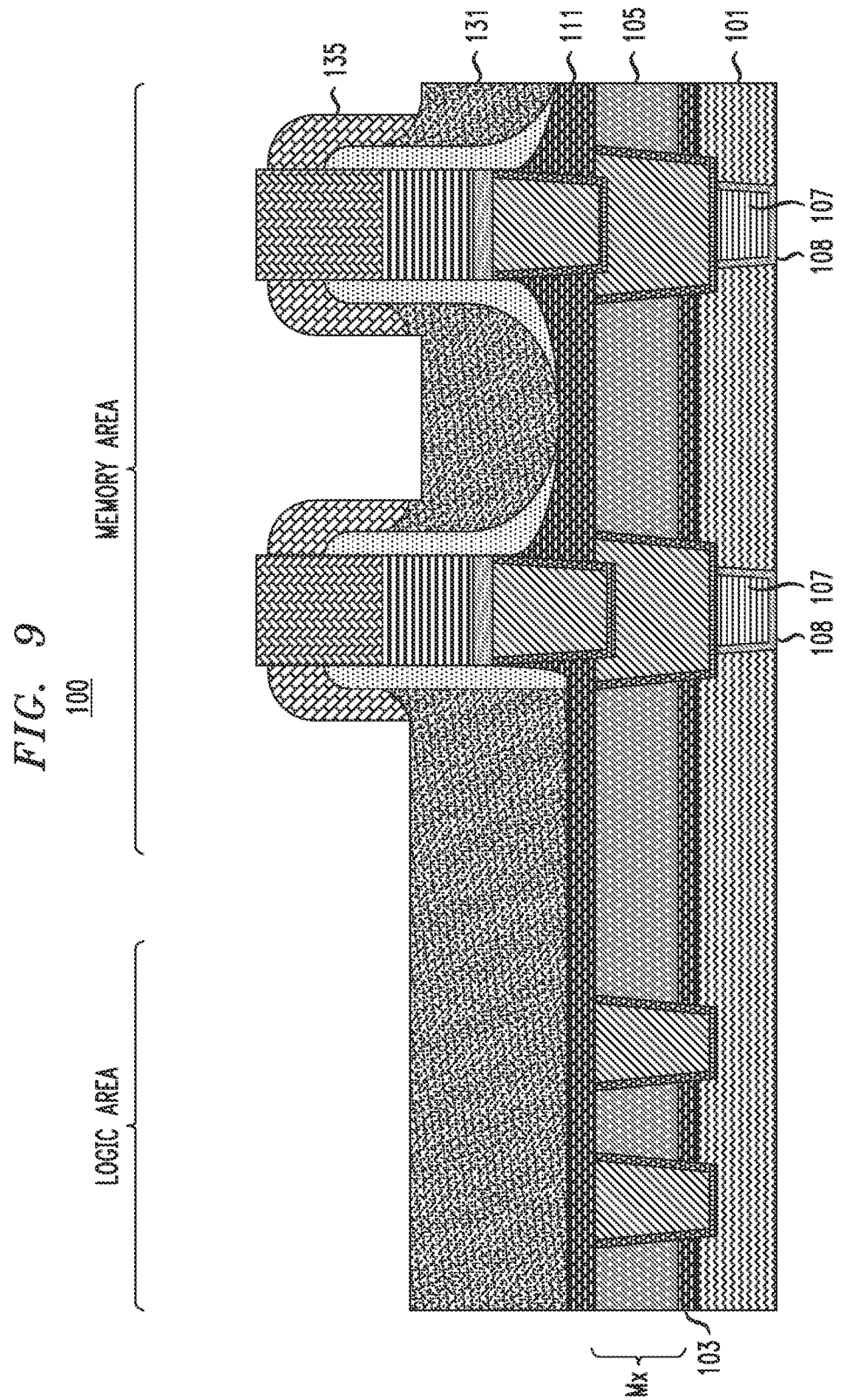
FIG. 9 is a schematic cross-sectional view illustrating etching back of the conductive cap layer from the structure of FIG. 8, according to an embodiment of the invention.

Referring to FIG. 9, portions of the conductive cap layer 135 are removed in, for example, an etchback process, which exposes portions of the second ILD layer 131 and a top surface and part of side surfaces of each of the top electrodes 124. Etchback process can use fluorocarbon or chlorine based chemistry ME or any other suitable ME chemistry depending on the material used for the conductive cap layer 135. According to an embodiment, an upper part of the side surfaces of each top electrode 124 is exposed by the removal of the portions of the conductive cap layer 135. Following the etchback process, the conductive cap layer 135 remains around other parts of the side surfaces of the top electrodes 124, and around the upper parts of the encapsulation layers 121 on the side surfaces of the top electrodes 124. Bottom surfaces of the remaining portions of the conductive cap layer are disposed on top surfaces of the second ILD layer 131. According to an embodiment, depending on the thickness (e.g., vertical height) of the second ILD layer 131, portions of the conductive cap layer 135 may also be formed around the portions of the encapsulation layers 121 on at least part of the side surfaces of the memory elements 123. The remaining conductive cap layers 135 in FIG. 9 cover the exposed top and side surfaces of the encapsulation layers 121. According to an embodiment, a horizontal thickness of the conductive cap layers 135 in FIG. 9 is about 10 nm to about 100 nm.

Figure 10:
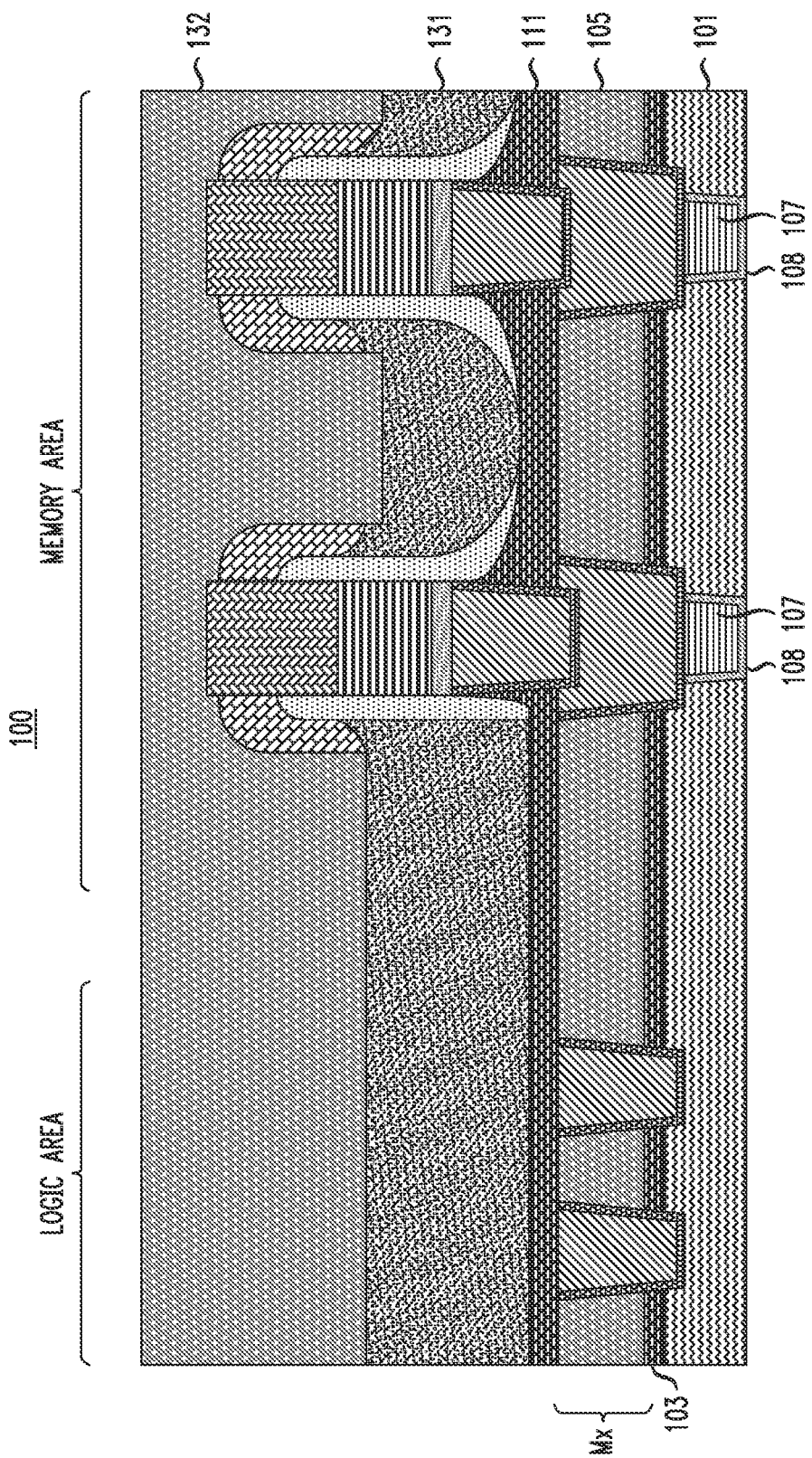
FIG. 10 is a schematic cross-sectional view illustrating deposition of an ILD layer on the structure of FIG. 9, according to an embodiment of the invention.

Referring to FIG. 10, a third ILD layer 132 is formed on the structure of FIG. 9. The third ILD layer 132 is formed on the exposed portions of the second ILD layer 131, the conductive cap layers 135 and the top electrodes 124. The third ILD layer 132 comprises the same or similar materials as those used for the first ILD layer 105, and is deposited using the same or similar deposition techniques as those used in connection with the deposition of the first ILD layer 105. As can be seen in FIG. 10, a height of the third ILD layer 132 extends beyond a top surface of the top electrode 124. According to an embodiment, a material of the third ILD layer 132 and a material of the second ILD layer 131 are able to be selectively etched with respect to a materials of the conductive layers 135 and the top electrodes 124. According to an embodiment, a material of the third ILD layer 132 and a material of the second ILD layer 131 are different from each other.

Referring to FIG. 11, using a dual damascene trench and via opening patterning process, portions of the second and third ILD layers 131 and 132 (e.g., portions not covered by a mask) are etched to form upper metallization level trenches, and a via opening. According to an embodiment, the etching is performed using, fluorocarbon based ME. A trench (where first contact 145a will be formed) and via opening (where via 137 will be formed) are formed in the second and third ILD layers 131 and 132 in the logic area. The via opening (and resulting via 137) is further formed through the second cap layer 111, until it reaches one of the contacts in the logic area. The via opening exposes a top surface of the fill layer 110.

The trench where second contact 145b will be formed is formed in the memory area over and around the stacked structures of the top electrodes 124, the memory elements 123 and the bottom electrodes 122 on the bottom electrode contacts 125. The trench is selectively etched with respect to the conductive cap layers 135 so that the conductive cap layers 135 remain covering the upper parts of the encapsulation layers 121. The trench where second contact 145b will be formed is formed over the memory device structures and extends downward into the second and third ILD layers 131 and 132 around the sides of the memory device structures stacked on the bottom electrode contacts 125 and around the sides of the encapsulation layers 121. In one or more embodiments, at least part of a bottom electrode 122 and/or at least part of a memory element 123 is above a lowermost surface of the trenches where first contact 145a and second contact 145b will be formed. For example, bottom or top surfaces of the bottom electrodes 122 or bottom surfaces of the memory elements 123 are above a lowermost surface of the trench where second contact 145b will be formed.

The trenches are filled with liner layers 139 and fill layers 140 to create first and second contacts 145a and 145b in an upper metallization level $M_{x+1}$ and a via 137 between lower and upper metallization levels $M_x$ and $M_{x+1}$. According to an embodiment, the first and second contacts 145a and 145b are bit line contacts. As can be seen in FIG. 11, the second contact 145b is disposed on top surfaces and upper portions of side surfaces of the top electrodes 124. The second contact 145b extends downward into the second and third ILD layers 131 and 132 around sides of the memory devices comprising the top electrodes 124, memory elements 123 and bottom electrodes 122, and, in some embodiments, extends below the bottom electrodes 122. The conductive cap layers 135 are disposed between the second contact 145b and the upper parts of the encapsulation layers 121, which prevents erosion of the encapsulation during contact trench formation. Since the encapsulation layer 121 remains and is not removed during contact trench formation due to the presence of the conductive cap layers 135, shorting between contacts and the memory elements 123 is avoided.

The second contact 145b is formed over the memory device structures and extends downward into the second and third ILD layers 131 and 132 around the sides of the memory device structures stacked on the bottom electrode contacts 125 and around the sides of the encapsulation layers 121. In one or more embodiments, at least part of a bottom electrode 122 and/or at least part of a memory element 123 is above a lowermost surface of each of the first and second contacts 145a and 145b. For example, bottom or top surfaces of the bottom electrodes 122 or bottom surfaces of the memory elements 123 are above a lowermost surface of the second contact 145b.

Portions of the second contact 145b are disposed on top surfaces of the conductive cap layers 135. The conductive cap layers 135 are disposed around the top electrodes 124 and a height of the top surfaces of the conductive cap layers 135 is lower than a height of the top surfaces of the top electrodes 124. The conductive cap layers are disposed on top and side surfaces of the encapsulation layers 121 between the second contact 145b and the top and side surfaces of the encapsulation layers 121. The top surfaces of the encapsulation layers 121 are at a height which is below a height of the top surfaces of the top electrodes 124, and below a height of the top surfaces of the conductive cap layers 135. The via 137 in the logic area connects the first contact 145a in upper metallization level $M_{x+1}$ with the underlying contact in lower metallization level $M_x$.

The fill layers 140 are formed on the liner layers 139. The liner layers 139 and the fill layers 140 comprise the same or similar material as that of the liner layers 109 and fill layers 110. The liner layers 139 are conformally formed on sidewalls and bottom surfaces of the trenches and on sidewalls of the via opening. A liner layer 139 may also be formed optionally on an upper surface of the contact below the via opening. The liner and fill layers 139 and 140 are deposited using the same or similar techniques to those used for deposition of the liner and fill layers 109 and 110, which can be followed by a planarization process such as, for example, CMP to planarize a top surface of the third ILD layer 132 and remove excess portions of the liner and fill layers 139 and 140. Portions of the liner layer 139 of second contact 145b are formed on the sides of the conductive cap layers 135.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors and sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a memory device comprising a first electrode, at least one memory element layer disposed on the first electrode, and a second electrode disposed on the at least one memory element layer;
   an encapsulation layer disposed around side surfaces of the memory device;
   a conductive cap layer disposed on a top surface of the encapsulation layer and around a portion of side surfaces of the encapsulation layer;
   wherein the conductive cap layer is disposed on side surfaces of the second electrode and an uppermost surface of the conductive cap layer is below a top surface of the second electrode; and
   a contact disposed on the top surface of the second electrode and extending around the conductive cap layer on the side surfaces of the second electrode.

2. The semiconductor structure of claim 1, wherein the conductive cap layer is disposed between the contact and the top surface of the encapsulation layer.

3. The semiconductor structure of claim 2, wherein the encapsulation layer is disposed around the second electrode and the top surface of the encapsulation layer is lower than the top surface of the second electrode.

4. The semiconductor structure of claim 1, wherein the conductive cap layer is disposed between the contact and the portion of the side surfaces of the encapsulation layer.

5. The semiconductor structure of claim 1, wherein at least part of the first electrode is above a lowermost surface of the contact.

6. The semiconductor structure of claim 1, wherein the at least one memory element layer is above a lowermost surface of the contact.

7. The semiconductor structure of claim 1, wherein the contact is disposed on at least a portion of the side surfaces of the second electrode.

8. The semiconductor structure of claim 1, further comprising a first electrode contact disposed under the first electrode, wherein the encapsulation layer is further disposed around side surfaces of the first electrode contact.

9. The semiconductor structure of claim 8, wherein the encapsulation layer extends from the second electrode to the first electrode contact.

10. The semiconductor structure of claim 1, wherein the encapsulation layer comprises a dielectric material.

11. The semiconductor structure of claim 1, further comprising a first dielectric layer disposed around a first part of the side surfaces of the memory device, wherein the conductive cap layer is disposed on the first dielectric layer.

12. The semiconductor structure of claim 11, further comprising a second dielectric layer disposed around a second part of the side surfaces of the memory device and on the first dielectric layer, wherein the first dielectric layer comprises a different material from the second dielectric layer.

13. A semiconductor structure, comprising:
    a first dielectric layer formed on a second dielectric layer;
    a memory device disposed in the first and second dielectric layers;
    wherein the memory device comprises a bottom electrode, at least one memory element layer disposed on the bottom electrode, and a top electrode disposed on the at least one memory element layer;
    an encapsulation layer disposed around side surfaces of the memory device; and
    a conductive cap layer disposed on a top surface of the encapsulation layer and around a portion of side surfaces of the encapsulation layer;
    wherein the conductive cap layer is disposed on side surfaces of the top electrode and an uppermost surface of the conductive cap layer is below a top surface of the top electrode.

14. The semiconductor structure of claim 13, wherein a bottom surface of the conductive cap layer is disposed on a top surface of the second dielectric layer.

15. The semiconductor structure of claim 14, wherein the encapsulation layer is disposed in the first and second dielectric layers.

16. The semiconductor structure of claim 13, further comprising a contact disposed in the first and second dielectric layers on the memory device and extending around the side surfaces of the memory device.

17. The semiconductor structure of claim 16, wherein:
    at least part of at least one of the bottom electrode and the at least one memory element layer are above a lowermost surface of the contact.

18. The semiconductor structure of claim 16, wherein the conductive cap layer is disposed between the contact and the top surface of the encapsulation layer, and between the contact and the portion of the side surfaces of the encapsulation layer.

19. A semiconductor structure, comprising:
- a dielectric encapsulation layer disposed around sides of a memory device structure comprising a bottom electrode, at least one memory element layer stacked on the bottom electrode, and a top electrode stacked on the at least one memory element layer;
- a dielectric layer disposed around a lower part of the dielectric encapsulation layer;
- a conductive cap layer disposed on the dielectric layer and on side surfaces of the top electrode, wherein the conductive cap layer covers an upper part of the dielectric encapsulation layer and an uppermost surface of the conductive cap layer is below a top surface of the top electrode; and
- a contact disposed over the memory device structure and extending downward around the side surfaces of the top electrode, side surfaces of the at least one memory element layer and side surfaces of the bottom electrode;
- wherein the conductive cap layer is further disposed between the contact and the upper part of the dielectric encapsulation layer.

20. The semiconductor structure of claim 19, wherein the contact is disposed on the top surface of the top electrode.

* * * * *